United States Patent
Yang et al.

(10) Patent No.: US 10,536,126 B2
(45) Date of Patent: Jan. 14, 2020

(54) NOTCH FILTER CAPABLE OF PARTIALLY SUPPRESSING/ATTENUATING SIGNAL FREQUENCY COMPONENTS AND ASSOCIATED FILTER CIRCUIT

(71) Applicant: MStar Semiconductor, Inc., Hsinchu Hsien (TW)

(72) Inventors: Fang-Ming Yang, Hsinchu Hsien (TW); Tai-Lai Tung, Hsinchu Hsien (TW); Ko-Yin Lai, Hsinchu Hsien (TW)

(73) Assignee: MEDIATEK INC., Hsinchu (TW)

( * ) Notice: Subject to any disclaimer, the term of this patent is extended or adjusted under 35 U.S.C. 154(b) by 110 days.

(21) Appl. No.: 15/854,951

(22) Filed: Dec. 27, 2017

(65) Prior Publication Data
US 2018/0191323 A1 Jul. 5, 2018

(30) Foreign Application Priority Data
Jan. 3, 2017 (TW) .............................. 106100003 A

(51) Int. Cl.
*H03H 7/01* (2006.01)
(52) U.S. Cl.
CPC ..... *H03H 7/0138* (2013.01); *H03H 2007/013* (2013.01)

(58) Field of Classification Search
CPC ..... H03H 17/04; H03H 7/0138; H03H 17/025
USPC .......................................................... 708/300
See application file for complete search history.

(56) References Cited

U.S. PATENT DOCUMENTS

| | | | | |
|---|---|---|---|---|
| 3,867,712 A | * | 2/1975 | Harthill | G01V 1/3826 114/144 B |
| 5,555,190 A | * | 9/1996 | Derby | G01F 1/8431 702/106 |
| 5,717,772 A | * | 2/1998 | Lane | H04R 3/02 381/83 |
| 2012/0330485 A1 | * | 12/2012 | Tamagawa | B60K 6/46 701/22 |

* cited by examiner

*Primary Examiner* — Tan V Mai
(74) *Attorney, Agent, or Firm* — McClure, Qualey & Rodack, LLP

(57) ABSTRACT

A notch filter appropriately adjusts the amount of attenuation at a center frequency of its notch band through changing or adjusting a value of an adjustable parameter A, and adaptively controls the amount of signal attenuation of a predetermined frequency component for an input signal that passes the notch filter, so as to partially suppress or partially attenuates the predetermined frequency component without affecting the size of a bandwidth of the notch filter.

9 Claims, 4 Drawing Sheets

NOTCH FILTER CAPABLE OF PARTIALLY SUPPRESSING/ATTENUATING SIGNAL FREQUENCY COMPONENTS AND ASSOCIATED FILTER CIRCUIT

This application claims the benefit of Taiwan application Serial No. 106100003, filed Jan. 3, 2017, the subject matter of which is incorporated herein by reference.

BACKGROUND OF THE INVENTION

Field of the Invention

The invention relates in general to a mechanism for notch filtering, and more particularly to a notch filter capable of adjusting the amount of attenuation at a center frequency of a stopband and an associated filter circuit to partially suppress a signal frequency component.

Description of the Related Art

In general, a notch filter filters out a signal component of a predetermined frequency, which is equivalently attenuating the signal component of that predetermined frequency from the perspective of the frequency domain. The size of a notch bandwidth of a conventional notch filter changes along with the amount of attenuation that the notch filter applies on the signal component of the predetermined frequency. More specifically, when the amount of attenuation that the notch filter applies on the signal component of the predetermined frequency decreases (i.e., partially attenuating the signal component of the predetermined frequency), the notch bandwidth of the conventional notch filter becomes narrower and may then be unsuitable for some signal processing circuits with specific requirements.

SUMMARY OF THE INVENTION

The invention is directed to a notch filter capable of adjusting the amount of attenuation at a center frequency of a notch band (or referred to as a stopband) and an associated filter circuit to overcome the above issues.

A notch filter is provided according to an embodiment of the present invention. The notch filter includes: a first adder, adding an input signal and an output of a first multiplier to generate an output; a delay circuit, coupled to the first adder, performing a unit delay on the output of the first adder to generate a delayed signal; the first multiplier, coupled to the delay circuit and the first adder, receiving the delayed signal, and multiplying a first parameter with the delayed signal according to the first parameter to generate the output of the first multiplier to the first adder; a second multiplier, multiplying a second parameter by an adjustable parameter to generate an intermediate signal; a third multiplier, coupled to the second multiplier and the delay circuit, multiplying the delayed signal by the intermediate signal to generate an output; and a second adder, coupled to the third multiplier and the input signal, adding the input signal and an inverted signal of the output of the second multiplier to generate an output signal of the notch filter.

A notch filter is further provided according to an embodiment of the present invention. The notch filter includes: a first delay circuit, receiving and delaying an input signal to generate a first delayed signal; a first multiplier, coupled to the first delay circuit, multiplying the first delayed signal by a first parameter to generate an output; a first adder, receiving the input signal, the output of the first multiplier and a feedback signal, and generating an output signal of the notch filter; a second delay circuit, receiving and delaying the output signal to generate a second delayed signal; and a second multiplier, coupled to the second delay circuit, multiplying a second parameter by the second delayed signal to generate the feedback signal to the first adder.

A filter circuit is further provided according to another embodiment of the present invention. The filter circuit includes: a notch filter, adjusting the amount of signal attenuation at a center frequency of the notch filter through an adjusting parameter A; and an adaptive estimating circuit, coupled to the notch filter, estimating a signal. The notch filter first partially suppresses a frequency component of an input signal of the filter circuit at the center frequency of the notch filter, to cause the adaptive estimating circuit to next estimate and track the partially suppressed input signal.

With almost no changes (equivalently substantially no changes) made to the notch bandwidth parameter and/or other parameters of the notch filter, the present invention readily and appropriately adjusts the amount of attenuation (i.e. changing the amplitude response) at the center frequency of the notch band (or referred to as stopband) of the notch filter by changing or adjusting the value of an adjustable parameter A, and adaptively controls the amount of signal attenuation of a predetermined frequency component for an input signal passing the notch filter, thereby partially suppressing or partially attenuating the predetermined frequency without affecting the size of the notch bandwidth of the notch filter.

The above and other aspects of the invention will become better understood with regard to the following detailed description of the preferred but non-limiting embodiments. The following description is made with reference to the accompanying drawings.

DETAILED DESCRIPTION OF THE INVENTION

A circuit structure of a notch filter is disclosed in the embodiments below. With almost no changes (equivalently substantially no changes) in a notch bandwidth parameter and/or other parameters of the notch filter, the notch filter of the present invention readily and appropriately adjusts the amount of attenuation (i.e. changing the amplitude response) at the center frequency of the notch band (or referred to as stopband) of the notch filter through modifying or adjusting an adjustable parameter A, and adaptively controls the amount of signal attenuation of a predetermined frequency component for an input signal passing the notch filter, thereby partially suppressing or partially attenuating the predetermined frequency without affecting the size of the notch bandwidth of the notch filter. Two possible embodiments are described in detail below. It should be noted that, any circuit structure that exercises the concept of the present invention is encompassed within the scope of the present invention.

Figure 1:
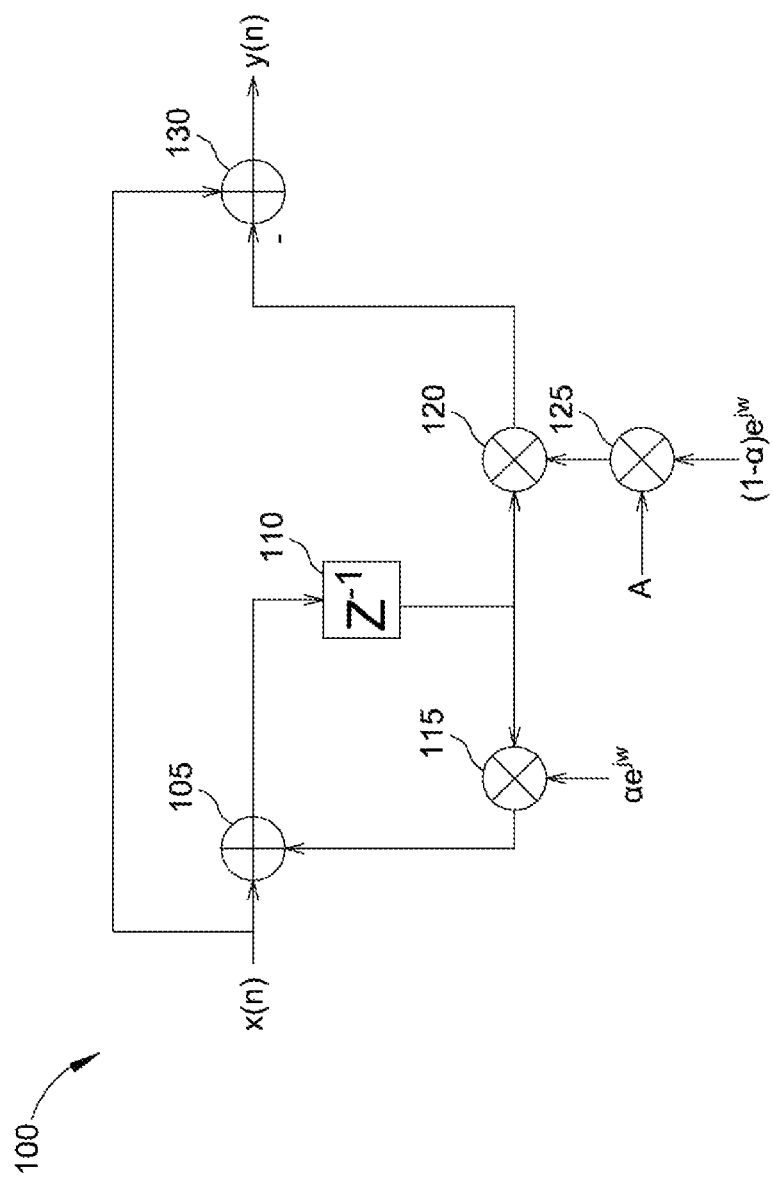
FIG. 1 is a circuit diagram of a notch filter according to a first embodiment of the present invention.

FIG. 1 shows a circuit diagram of a notch filter 100 according to a first embodiment of the present invention. The notch filter 100 includes an adder 105, a delay circuit 110, multipliers 115, 120 and 125, and an adder 130. The adder 105 receives an input signal x(n) and an output signal of the multiplier 115. The delay circuit 110, coupled to the adder 105, serves as a buffer, and delays an output signal of the adder 105 by one unit time to generate a delayed signal. The multiplier 115, coupled to the delay circuit 110 and the adder 105, receives the delayed signal, and generates a product of a first parameter and the delayed signal as its output signal according to the first parameter. The first parameter is $\alpha \times e^{j\omega}$, where $\alpha$ is a parameter for setting a notch band of the notch filter 100. In general, $\alpha$ is a value smaller than 1, and $\omega$ is a center frequency parameter of the notch bandwidth.

The multiplier 125 generates a product of an adjustable parameter A and a second parameter $(1-\alpha) \times e^{j\omega}$ as its output signal according to the adjustable parameter A. The multiplier 120 multiplies the output signal of the multiplier 125 by the delayed signal to generate its output signal. The adder 130, coupled to an output of the multiplier and the input signal x(n), adds the input signal x(n) and an inverted signal (denoted by "–") of the output signal of the multiplier 120 to generate an output signal y(n).

A conversion function H(z) of the circuit structure of the notch filter 100 in FIG. 1 may be represented as:

$$H(z) = 1 - A \times \frac{(1-\alpha) \times e^{j\omega} \times z^{-1}}{1 - \alpha \times e^{j\omega} \times z^{-1}}$$

Figure 2:
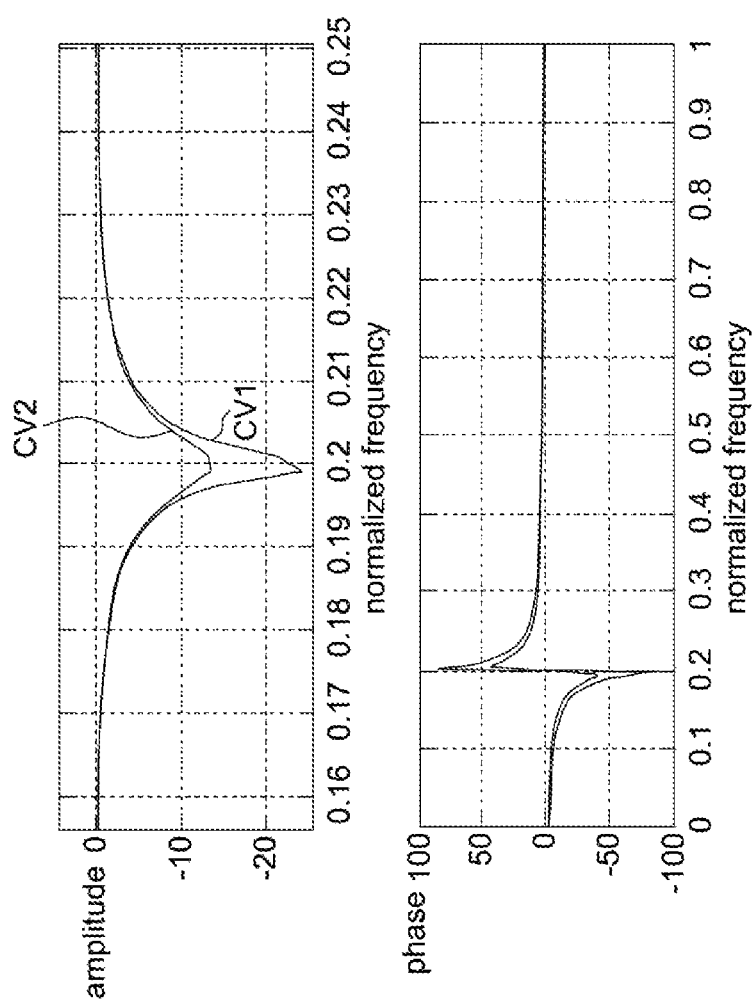
FIG. 2 is a schematic diagram of an amplitude response and a phase response of the notch filter in FIG. 1 according to an embodiment of the present invention.

FIG. 2 shows a schematic diagram of an amplitude response and a phase response of the notch filter 100 in FIG. 1 according to an embodiment of the present invention. As shown in the upper half of FIG. 2, through adjusting the value of the adjustable parameter A, the size of the amplitude response may be appropriately changed without modifying the bandwidth of the notch band (stopband) of the notch filter 100, and characteristics such as the phase response can remain substantially unchanged. For example, the curve CV1 depicts the amplitude response when the adjustable parameter A is set to 1, and CV2 depicts the amplitude response when the adjustable parameter A is set to 0.8. As seen from the diagram, without changing the bandwidth parameter a and/or other parameters, the size of amplitude response of the notch filter 100 can be readily and appropriately adjusted to adaptively control the amount of signal attenuation at the center frequency of the input signal x(n), thereby partially suppressing the frequency component of the input signal x(n) near the above center frequency to generate the input signal y(n).

Figure 3:
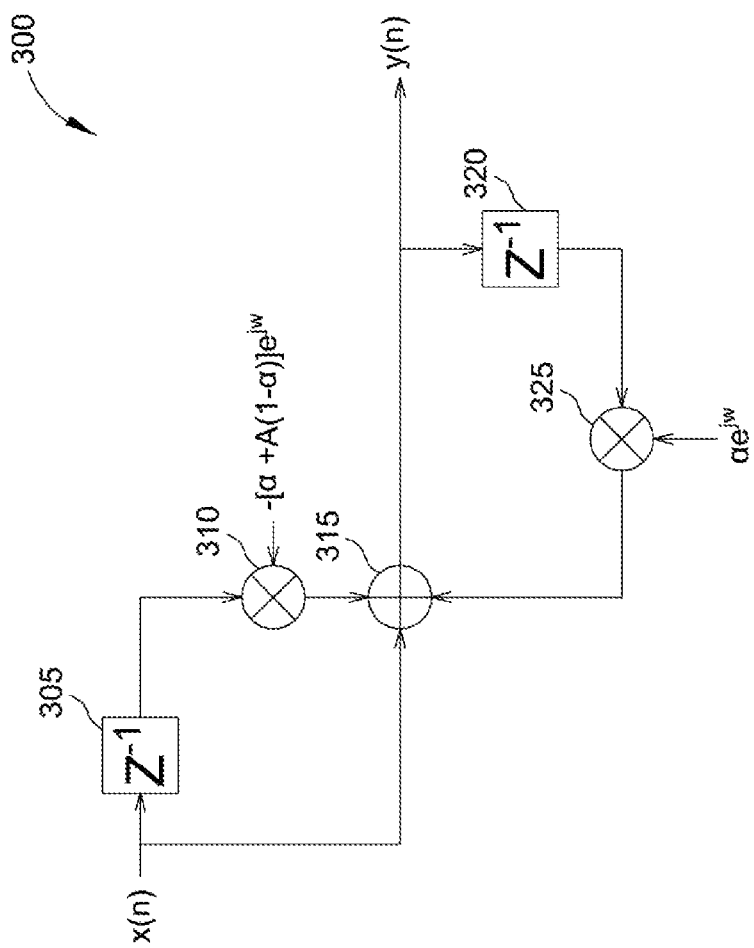
FIG. 3 is a circuit diagram of a notch filter according to a second embodiment of the present invention.

FIG. 3 shows a circuit diagram of a notch filter 300 according to a second embodiment of the present invention. The notch filter 300 includes a delay circuit 305 (serving as a buffer), a multiplier 310, an adder 315, a delay circuit 320 (serving as a buffer) and a multiplier 325. The delay circuit 302 receives and delays an input signal x(n) to generate a delayed signal to the multiplier 310. According to a first parameter (i.e., $-[\alpha+A \times (1-\alpha)] \times e^{j\omega}$, the multiplier 310 multiplies the first parameter by the delayed signal to generate an output signal to the adder 315. The adder 315, coupled to the multiplier 310, the delay circuit 320 and the multiplier 325, adds the input signal x(n), the output signal of the multiplier 310 and the output signal of the multiplier 325 to generate an output signal y(n). The delay circuit 320 receives and delays the output signal y(n) to generate a delayed signal to the multiplier 325. According to a second parameter (i.e., $\alpha \times e^{j\omega}$), the multiplier 325 multiples the second parameter by the delayed signal of the delay circuit 320 to generate an output signal to the adder 315. In the first parameter, A is an adjustable parameter, $\alpha$ is a parameter for setting the notch bandwidth of the notch filter 300, and $\omega$ is a center frequency parameter of the notch bandwidth.

A conversion function of the circuit structure of the notch filter 300 in FIG. 3 may be represented as:

$$H(z) = \frac{1 - [\alpha + A \times (1-\alpha)] \times e^{j\omega} \times z^{-1}}{1 - \alpha \times e^{j\omega} \times z^{-1}}$$

The amplitude response and the phase response of the circuit structure of the notch filter 300 of the embodiment in FIG. 3 are similar to the amplitude response and the phase response of the embodiment in FIG. 2, and associated details are omitted herein.

Further, the notch filter of the embodiment may be coordinated with an adaptive estimating circuit. More specifically, the noise component of a predetermined frequency in the input signal x(n) is first partially suppressed by using the notch filter through adjusting the value of the adjustable parameter A, and the signal component in the partially suppressed input signal x(n) is then estimated and tracked by the adaptive estimating circuit. Because the noise component of a predetermined frequency in the input signal x(n) is partially suppressed, the adaptive estimating circuit is allowed to accurately estimate and track the noise component of the predetermined frequency in the partially suppressed input signal x(n) by a faster convergence speed, and the noise component may then be removed from the partially suppressed input signal x(n).

Figure 4:
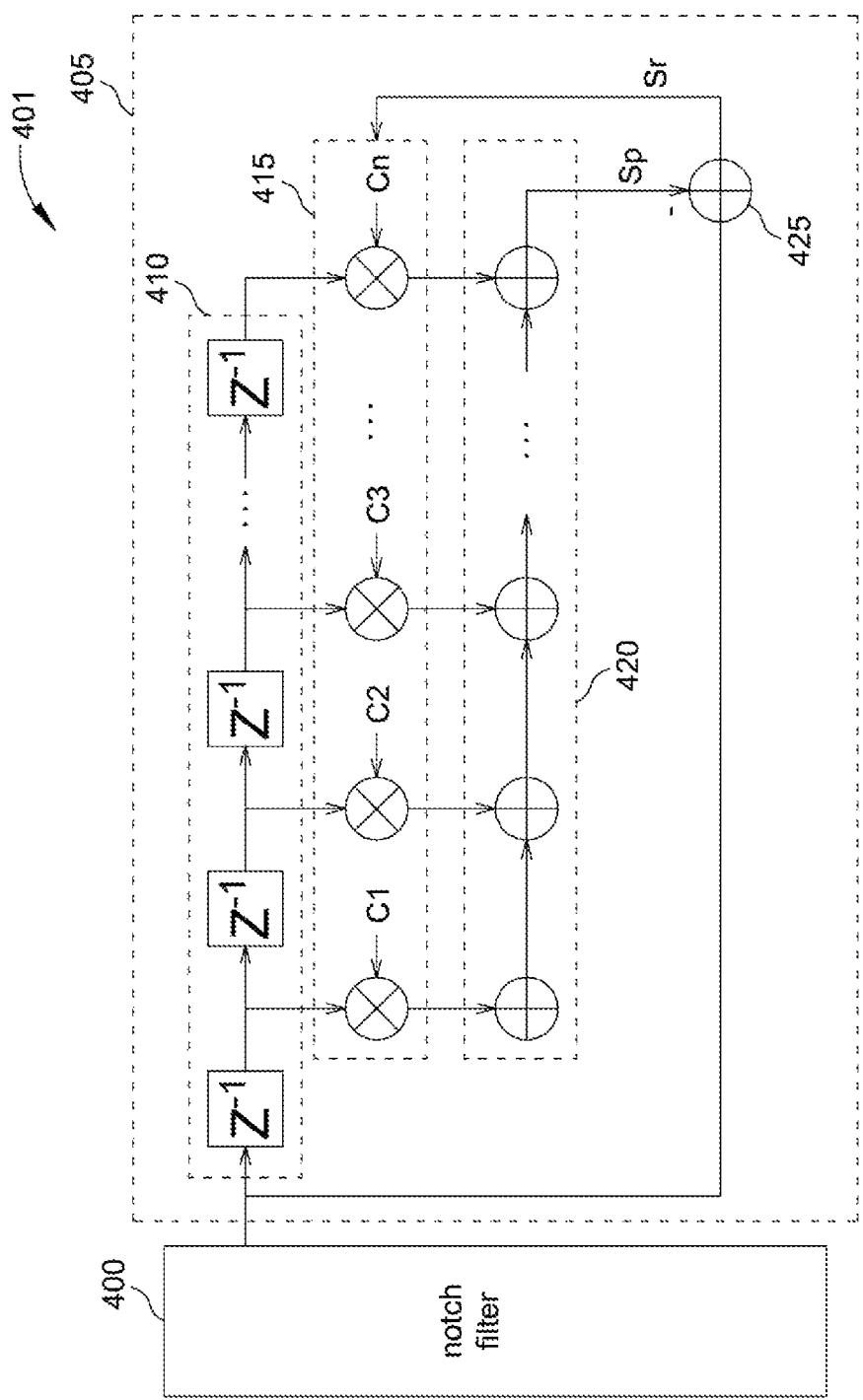
FIG. 4 is a circuit diagram of a notch filter according to a third embodiment of the present invention.

FIG. 4 shows a circuit diagram of a filter circuit 401 according to a third embodiment of the present invention. The filter circuit 401 includes a notch filter 400 and an adaptive estimating circuit 405. The circuit structure of the notch filter 400 may be implemented by the notch filter 100 in FIG. 1 or the notch filter 300 in FIG. 3. The adaptive estimating circuit 405 includes a delay circuit 410 (including n delay circuits connected in series, with the first delay circuit receiving the input signal), a multiplication circuit 415 (including n multipliers), an addition circuit 420 (including n adders connected in series) and an adder 425, where n is a value greater than or equal to 2. Each multiplier is connected to an output of the corresponding delay circuit, and multiples the output of the corresponding multiplier by a corresponding parameter (C1, C2, . . . and Cn) to generate a corresponding product to a corresponding adder among the adders 420. The n adders add the products of the individual multipliers to generate an estimated signal Sp (an estimated noise signal). The adder 425 adds the received input signal and an inverted signal of the estimated noise signal Sp to generate an error signal Sr, and outputs the error signal Sr to the multiplication circuit 415 to adjust the corresponding parameters C1, C2, . . . and Cn. During a converging process of the adaptive estimating circuit 405, the estimated nose signal Sp is the estimated noise component of the input signal, and a result of subtracting the estimated noise signal Sp from the output signal y(n) of the notch filter 400 is the output of the filter circuit 401.

Some benefits of the above filter circuit 401 are that, by adjusting the value of the adjustable parameter A (as shown in FIG. 2) using the notch filter 400, the noise component of a predetermined frequency in the signal x(n) may be partially suppressed to generate the signal y(n), which is the signal x(n) having been partially suppressed and includes the noise component signal of the predetermined frequency in the original input signal x(n). Thus, the adaptive estimating circuit 405 is allowed to accurately estimate and track the noise component signal by a faster convergence speed to more easily remove the noise component from the input signal x(n), particularly when the noise component signal includes a jittering frequency component.

It should be noted that, in an alternative embodiment, the notch filter 400 and the adaptive estimating circuit 402 may operate in different frequency domains. In other words, the notch filter 400 and the adaptive estimating circuit 405 may have different operating frequencies, and other circuits that perform frequency conversion may be disposed between the notch filter 400 and the adaptive estimating circuit 405.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A notch filter, comprising:
   a first adder, adding an input signal and an output of a first multiplier to generate an output;
   a delay circuit, coupled to the first adder, performing a unit delay on the output of the first adder to generate a delayed signal; wherein, the first multiplier, coupled to the delay circuit and the first adder, receives the delayed signal, and multiplies a first parameter by the delayed signal to generate the output of the first multiplier to the first adder;
   a second multiplier, multiplying a second parameter and an adjustable parameter to generate an intermediate signal;
   a third multiplier, coupled to the second multiplier and the delay circuit, multiplying the delayed signal by the intermediate signal to generate an output; and
   a second adder, coupled to the third multiplier and the input signal, adding the input signal and an inverted signal of the output of the second multiplier to generate an output signal of the notch filter.

2. The notch filter according to claim 1, wherein the adjustable parameter is for adjusting an amount of signal attenuation at a center frequency of the notch filter to adjust an amount of attenuation of a signal component of the input signal at the center frequency.

3. The notch filter according to claim 1, wherein the first parameter is $\alpha \times e^{j\omega}$, the second parameter is $(1-\alpha) \times e^{j\omega}$, $\alpha$ is a parameter for setting a notch bandwidth of the notch filter, and $\omega$ is a center frequency parameter.

4. A notch filter, comprising:
   a first delay circuit, receiving and delaying an input signal to generate a first delayed signal;
   a first multiplier, coupled to the first delay circuit, multiplying the first delayed signal by a first parameter to generate an output;
   a first adder, receiving the input signal, the output of the first multiplier and a feedback signal, and generating an output signal of the notch filter;
   a second delay circuit, receiving and delaying the output signal to generate a second delayed signal; and
   a second multiplier, coupled to the second delay circuit, multiplying a second parameter by the second delayed signal to generate the feedback signal to the first adder.

5. The notch filter according to claim 4, wherein the first parameter is $-[\alpha+A\times(1-\alpha)] \times e^{j\omega}$, the second parameter is $\alpha \times e^{j\omega}$, $\alpha$ is a parameter for setting a notch bandwidth of the notch filter, $\omega$ is a center frequency parameter, and A is an adjustable parameter for adjusting an amount of signal attenuation at a center frequency of the notch filter to adjust an amount of attenuation of a signal component of the input signal at the center frequency.

6. A filter circuit, comprising:
   a notch filter, adjusting an amount of signal attenuation of a center frequency of the notch filter according to an adjustable parameter A, wherein the adjustable parameter A includes a parameter not equal to the center frequency; and
   an adaptive estimating circuit, coupled to the notch filter, estimating a signal;
   wherein, the notch filter first partially suppresses a frequency component of the input signal at the center frequency of the notch filter to cause the adaptive estimating circuit to subsequently estimate and track the partially suppressed input signal.

7. The filter circuit according to claim 6, wherein the notch filter comprises:
   a first adder, adding an input signal and an output of a first multiplier to generate an output;
   a delay circuit, coupled to the first adder, performing a unit delay on the output of the first adder to generate a delayed signal; wherein, the first multiplier, coupled to the delay circuit and the first adder, receives the delayed signal, and multiplies a first parameter by the delayed signal to generate the output of the first multiplier to the first adder;
   a second multiplier, multiplying a second parameter and an adjustable parameter according to the second parameter and the adjustable parameter to generate an intermediate signal;
   a third multiplier, coupled to the second multiplier and the delay circuit, multiplying the delayed signal by the intermediate signal to generate an output; and
   a second adder, coupled to the third multiplier and the input signal, adding the input signal and an inverted signal of the output of the second multiplier to generate an output signal of the notch filter.

8. The filter circuit according to claim 6, wherein the notch filter comprises:
   a first delay circuit, receiving and delaying an input signal to generate a first delayed signal;
   a first multiplier, coupled to the first delay circuit, multiplying the first delayed signal by a first parameter to generate an output;
   a first adder, receiving the input signal, the output of the first multiplier and a feedback signal, and generating an output signal of the notch filter;
   a second delay circuit, receiving and delaying the output signal to generate a second delayed signal; and
   a second multiplier, coupled to the second delay circuit, multiplying a second parameter by the second delayed signal to generate the feedback signal to the first adder.

9. The filter circuit according to claim 6, wherein the adaptive estimating circuit comprises:
   a delay circuit, comprising a plurality of delay circuit connected in series;

a multiplication circuit, comprising a plurality of multipliers, each of the multipliers connected to an output of a corresponding delay circuit among the delay circuits, and multiplying the output of the corresponding delay circuit by a corresponding parameter according to the corresponding parameter;

an addition circuit, comprising a plurality of adders connected in series, each of the adders connected to an output of one corresponding adders among the adders, the adders adding the plurality of outputs of the multipliers to generate an estimated signal; and an overall adder, connected to the addition circuit, adding the partially suppressed input signal and an inverted signal of the estimated signal to generate an error signal, which is for adjusting the plurality of corresponding parameters of the adders.

\* \* \* \* \*